United States Patent
Ding et al.

(10) Patent No.: US 11,086,439 B2
(45) Date of Patent: Aug. 10, 2021

(54) DISPLAY PANEL WITH METAL MESH UNITS AND DISPLAY APPARATUS

(71) Applicant: Shanghai Tianma Micro-Electronics Co., Ltd., Shanghai (CN)

(72) Inventors: Hong Ding, Shanghai (CN); Qijun Yao, Shanghai (CN); Xiaoyue Su, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/730,003

(22) Filed: Dec. 30, 2019

(65) Prior Publication Data

US 2020/0310586 A1 Oct. 1, 2020

(30) Foreign Application Priority Data

Mar. 29, 2019 (CN) .......................... 201910251117.X

(51) Int. Cl.
| | |
|---|---|
| *G06F 3/041* | (2006.01) |
| *H01L 27/32* | (2006.01) |
| *H01L 51/00* | (2006.01) |
| *H01L 51/52* | (2006.01) |

(52) U.S. Cl.
CPC .......... *G06F 3/0416* (2013.01); *G06F 3/0412* (2013.01); *H01L 27/323* (2013.01); *H01L 51/0097* (2013.01); *H01L 51/5237* (2013.01); *G06F 2203/04112* (2013.01)

(58) Field of Classification Search
None
See application file for complete search history.

(56) References Cited

U.S. PATENT DOCUMENTS

| | | | | |
|---|---|---|---|---|
| 2012/0169401 A1* | 7/2012 | Hristov | .................. | G06F 3/0416 327/517 |
| 2016/0109998 A1* | 4/2016 | Watanabe | ............. | G06F 3/0412 349/12 |
| 2020/0026383 A1* | 1/2020 | Hwang | ............... | G06F 3/04162 |
| 2020/0192525 A1* | 6/2020 | Li | .......................... | G06F 3/0446 |
| 2020/0210005 A1* | 7/2020 | Kim | ...................... | G06F 3/0412 |

FOREIGN PATENT DOCUMENTS

| | | |
|---|---|---|
| CN | 1656851 A | 8/2005 |
| CN | 108089748 A | 5/2018 |
| CN | 108089762 A | 5/2018 |
| CN | 109213369 A | 1/2019 |

* cited by examiner

*Primary Examiner* — Kirk W Hermann
(74) *Attorney, Agent, or Firm* — Anova Law Group, PLLC

(57) ABSTRACT

Display panel and display apparatus are provided. The display panel includes a display layer and a touch control layer. The display layer includes pixel units each including a number of sub-pixels arranged as a matrix. The touch control layer includes a bridge layer, a touch control metal layer, and an insulation layer there-between. The touch control metal layer includes metal mesh units, corresponding to the pixel units. In the touch control metal layer, adjacent metal mesh units are not connected. The touch control layer also includes at least one first touch control electrode, each including multiple metal mesh units. Adjacent two metal mesh units of the multiple metal mesh units are electrically connected through a connection lead. The connection lead is disposed on the bridge layer and electrically connected to each of the adjacent two metal mesh units through a corresponding via hole in the insulation layer.

16 Claims, 8 Drawing Sheets

200

DISPLAY PANEL WITH METAL MESH UNITS AND DISPLAY APPARATUS

CROSS-REFERENCES TO RELATED APPLICATIONS

This application claims priority of Chinese Patent Application No. 201910251117.X, filed on Mar. 29, 2019, the entire contents of which are hereby incorporated by reference.

FIELD OF THE DISCLOSURE

The present disclosure generally relates to the field of display technology and, more particularly, relates to a display panel and a display apparatus.

BACKGROUND

In recent years, organic light-emitting devices (Organic Light-Emitting Diode, OLED) have become very popular devices in flat-panel display industry and have been hailed as the next generation of "star" flat-panel display devices. The OLEDs have the advantages of self-luminous, wide viewing angle, fast response time, high light-emitting efficiency, small panel thickness, large size and flexible panel, simple fabrication process and low cost, etc.

Further, the touch screen technology has gradually replaced the key-board technology as the mainstream technology of mobile terminals. When a touch screen mounted on the front side of a display apparatus is touched by a finger, or a pen, etc., the touched position is detected and sent to the CPU and the input information are determined. At present, the touch screen has been widely used in mobile terminals (such as touch mobile phones and laptop computers), human-machine display interfaces in the industrial automation industry, etc.

To realize the touch function of the display apparatus, it is generally required to introduce touch control electrodes into the display apparatus, and different touch control electrodes are insulated from each other. This requires a non-continuous touch metal layer. However, if a density or position of non-continuous regions in the touch metal layer is uneven or different, the display performance of the display apparatus is affected. The disclosed display panel and display apparatus are directed to solve one or more problems set forth above and other problems in the art.

BRIEF SUMMARY OF THE DISCLOSURE

One aspect of the present disclosure provides a display panel. The display panel includes a display layer and a touch control layer, stacked together. The display layer includes a plurality of pixel units on a substrate, one pixel unit of the plurality of pixel units including a number N of sub-pixels arranged as a matrix. The number N is greater than or equal to 3 and smaller than or equal to 8. The touch control layer includes a bridge layer, an insulation layer and a touch control metal layer, the insulation layer being disposed between the bridge layer and the touch control metal layer. The touch control metal layer includes a plurality of metal mesh units. The plurality of metal mesh units corresponds to the plurality of pixel units. In the touch control metal layer, adjacent metal mesh units of the plurality of metal mesh units are not connected. The touch control layer also includes at least one first touch control electrode. One first touch control electrode of the at least one first touch control electrode includes multiple metal mesh units of the plurality of metal mesh units. In the one first touch control electrode, adjacent two metal mesh units of the multiple metal mesh units are electrically connected through a connection lead. The connection lead is disposed on the bridge layer. The insulation layer includes a plurality of via holes. The connection lead is electrically connected to each of the adjacent two metal mesh units in the one first touch control electrode through a corresponding via hole in the insulation layer.

Another aspect of the present disclosure provides a display apparatus. The display apparatus includes a display panel. The display panel includes a display layer and a touch control layer, stacked together. The display layer includes a plurality of pixel units on a substrate, one pixel unit of the plurality of pixel units including a number N of sub-pixels arranged as a matrix. The number N is greater than or equal to 3 and smaller than or equal to 8. The touch control layer includes a bridge layer, an insulation layer and a touch control metal layer, the insulation layer being disposed between the bridge layer and the touch control metal layer. The touch control metal layer includes a plurality of metal mesh units. The plurality of metal mesh units corresponds to the plurality of pixel units. In the touch control metal layer, adjacent metal mesh units of the plurality of metal mesh units are not connected. The touch control layer also includes at least one first touch control electrode. One first touch control electrode of the at least one first touch control electrode includes multiple metal mesh units of the plurality of metal mesh units. In the one first touch control electrode, adjacent two metal mesh units of the multiple metal mesh units are electrically connected through a connection lead. The connection lead is disposed on the bridge layer. The insulation layer includes a plurality of via holes. The connection lead is electrically connected to each of the adjacent two metal mesh units in the one first touch control electrode through a corresponding via hole in the insulation layer.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
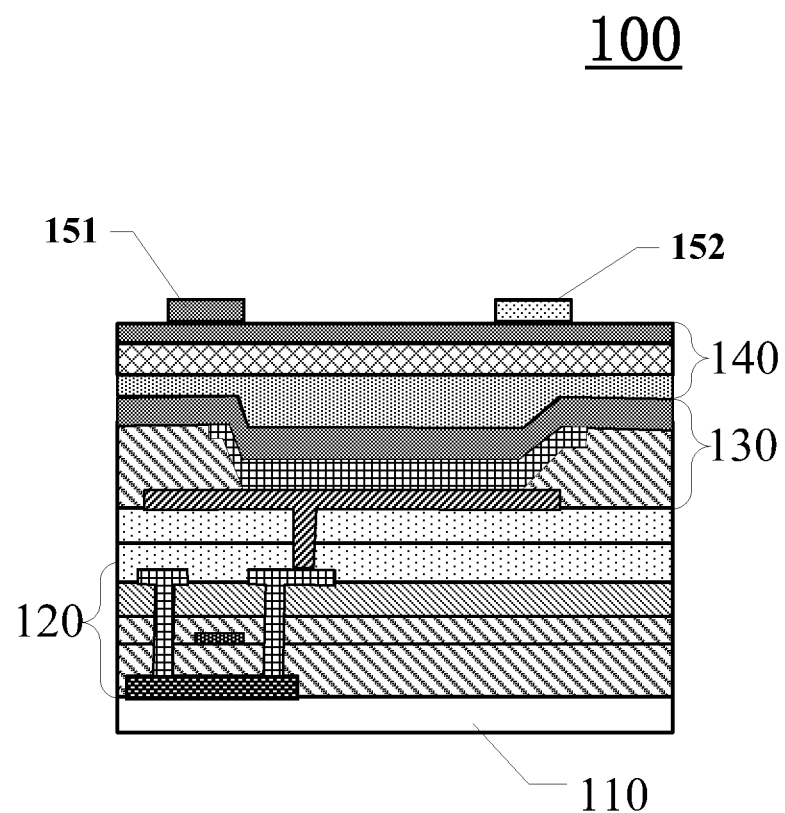
FIG. 1 illustrates a cross-sectional view of an existing display panel.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

Figure 2:
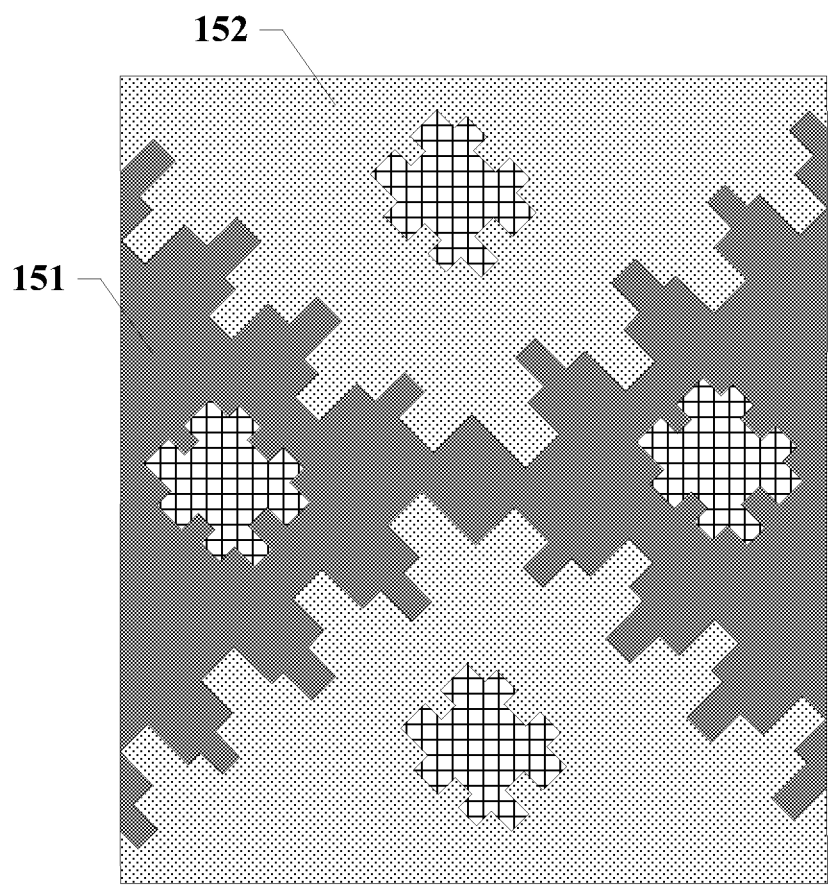
FIG. 2 illustrates a relative position relationship of existing touch control electrodes.

FIG. 1 illustrates a cross-sectional view of an existing display panel; and FIG. 2 is a relative position relationship of touch control electrodes in the display panel. As shown in FIGS. 1-2, the display panel 100 includes a substrate 110, a transistor array 120, a light-emitting function layer 130, an encapsulation layer 140 and a touch control metal layer disposed in sequence. The touch control metal layer includes a plurality of first touch control electrodes 151 and a plurality of second touch control electrodes 152. The first touch control electrodes 151 and the adjacent second touch control electrodes 152 are insulated from each other. The first touch control electrodes 151 and the second touch control electrodes 152 are generally formed in the form of a metal mesh. To achieve an insulation between the first touch control electrodes 151 and the second touch control electrodes 152, the metal mesh between the first touch control electrodes 151 and the adjacent second touch control electrodes 152 may be broken to become non-continuous, and the non-continuous regions of the metal mesh are all located at the edge positions of the first touch control electrodes 151 and the second touch control electrodes 152. As shown in FIG. 2, during the displaying process of the display panel, the issue that the edges of the touch control electrodes are visible may significantly affect the display performance of the display apparatus.

The present disclosure provides a display panel and a display apparatus with an improved performance. In the display panel, the touch control metal layer may be divided into a plurality of metal mesh units corresponding to pixel units, and adjacent metal mesh units may be electrically connected through the via holes disposed in the insulation layer and the connection vias disposed on the bridging layer. In the touch control metal layer, the edge and the inside of a same first touch control electrode may be broken to become non-continuous and the breaking manner may be the same such that the non-continuous regions may be relatively uniform. Thus, the unacceptable display performance of the display panel caused by the uneven density of non-continuous regions and position differences of non-continuous regions may be avoided. Accordingly, the display effect may be more uniform, and the fingerprint identification under the optical screen may be improved. In addition, the way of providing the via holes in the insulation layer in the touch control layer may also facilitate to enhance the bending performance of the display panel and the display apparatus.

Figure 3:
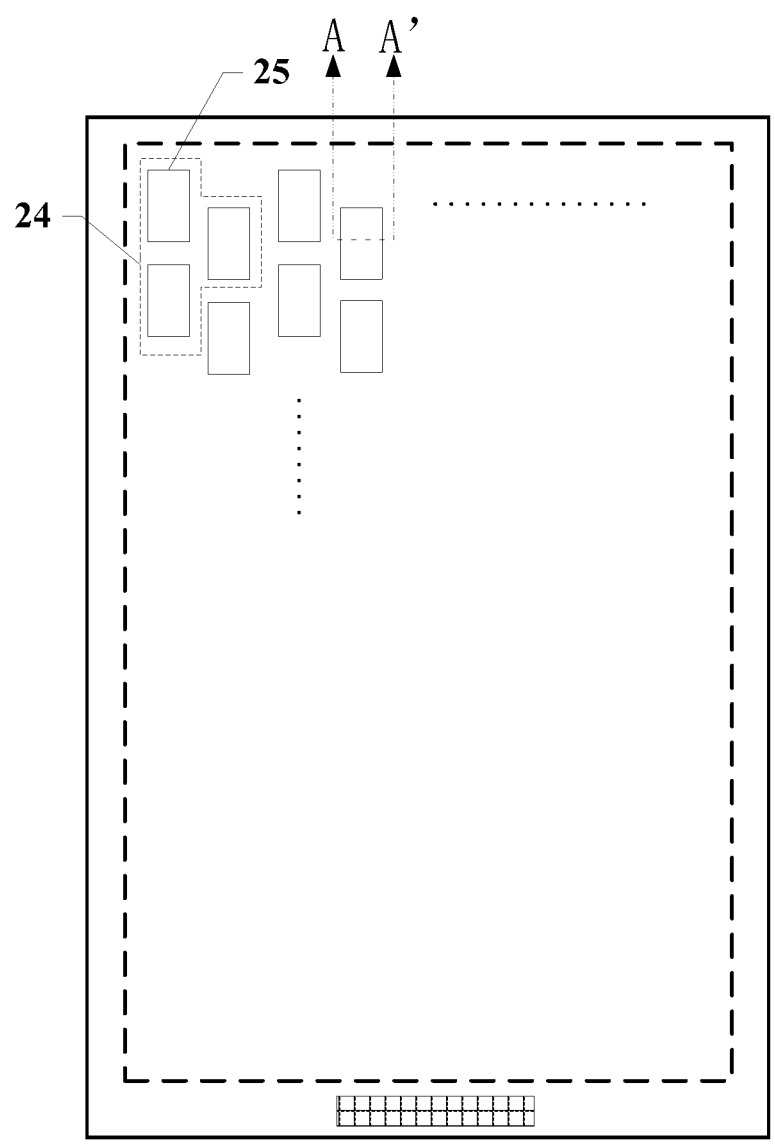
FIG. 3 illustrates a top view of an exemplary display panel consistent with various disclosed embodiments of the present disclosure.
Figure 4:
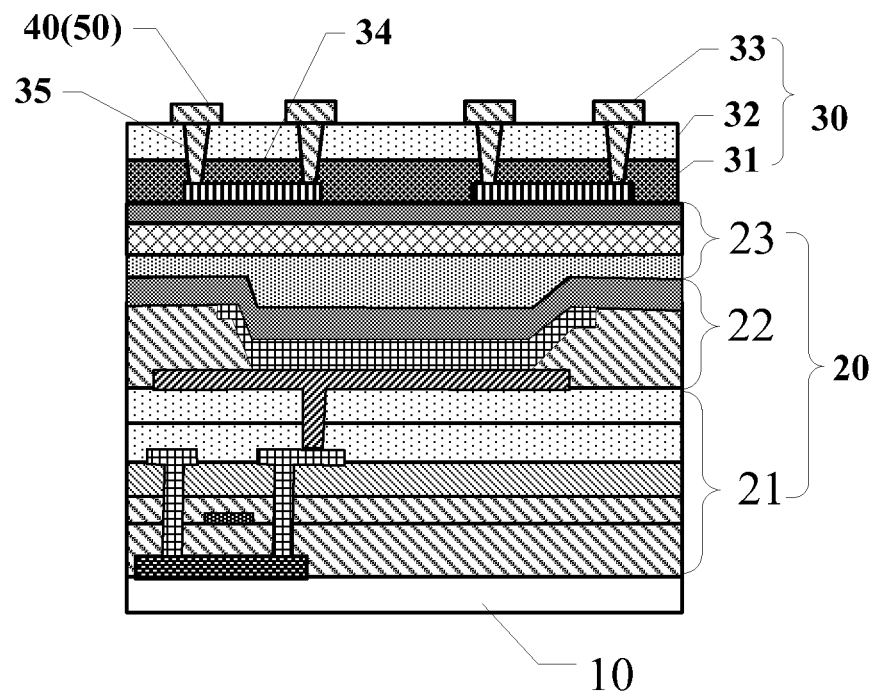
FIG. 4 illustrates an AA'-sectional view of an exemplary display panel consistent with various disclosed embodiments of the present disclosure.
Figure 5:
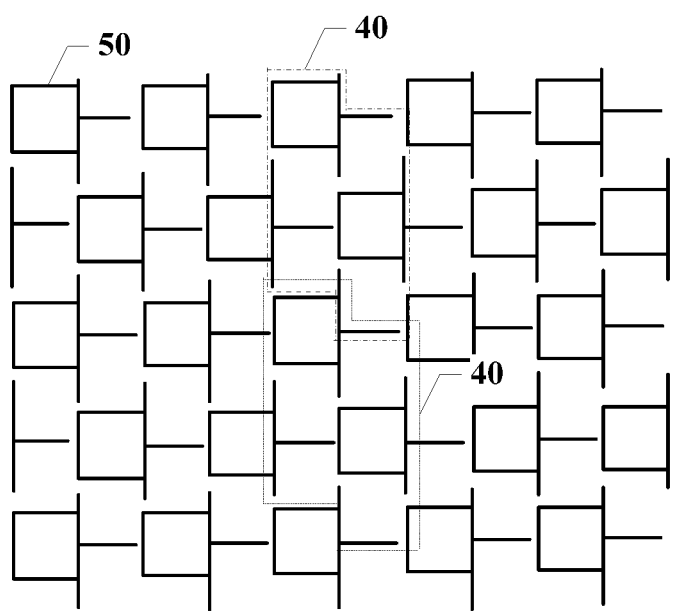
FIG. 5 illustrates a partial top view of a touch control metal layer of an exemplary display panel consistent with various disclosed embodiments of the present disclosure.
Figure 6:
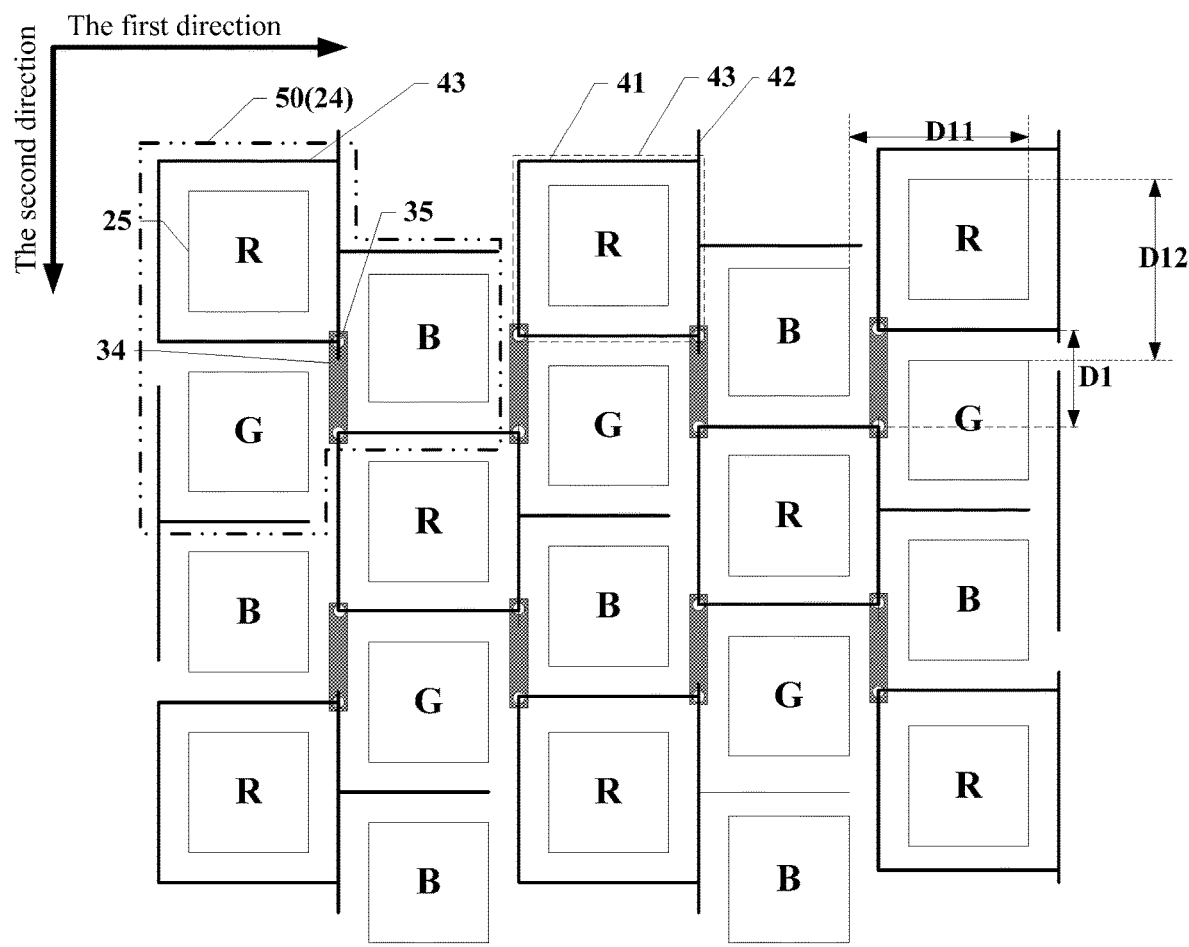
FIG. 6 illustrates a relative position relationship between the pixels and the metal mesh units of an exemplary display panel consistent with various disclosed embodiments of the present disclosure.
Figure 7:
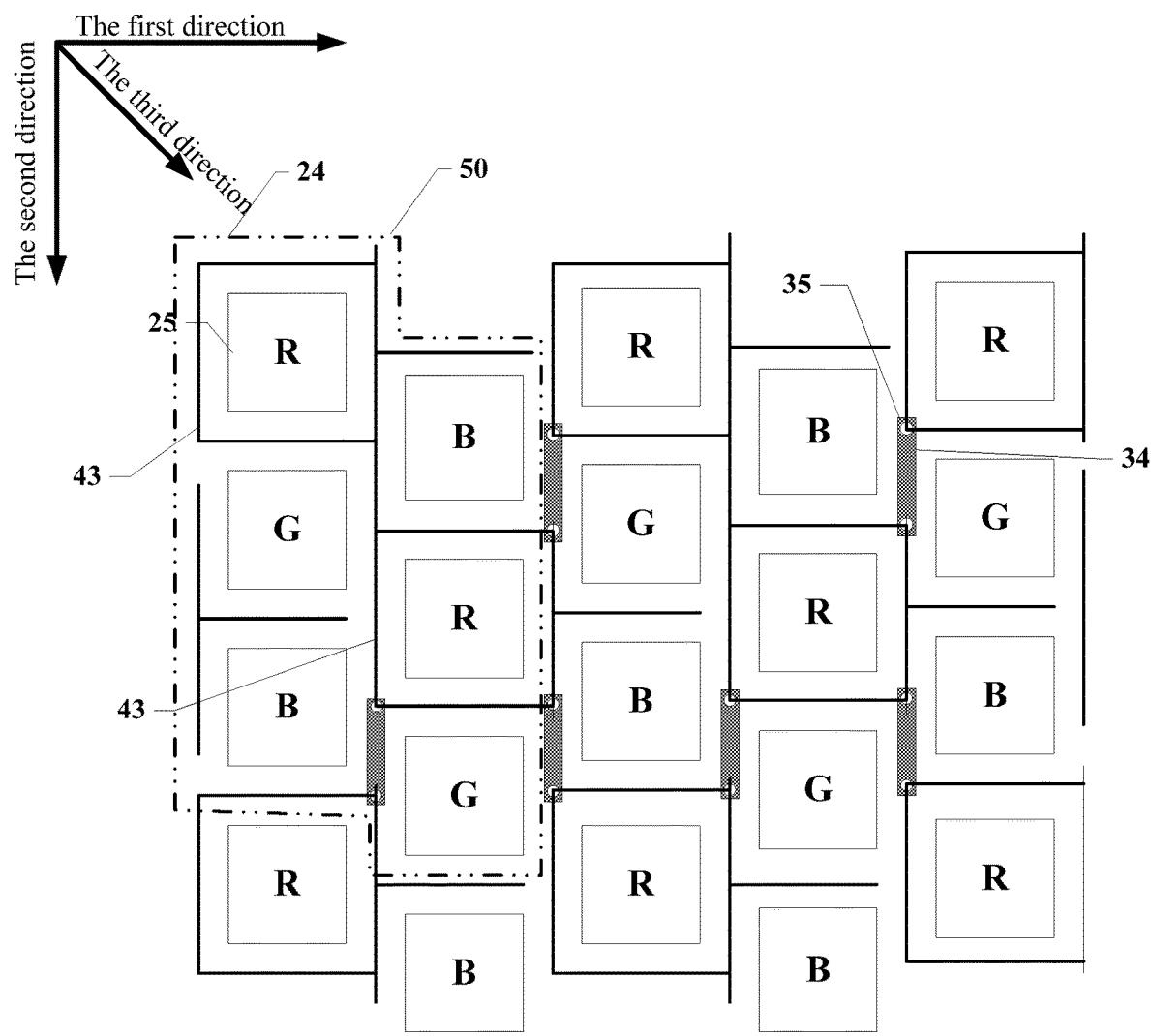
FIG. 7 illustrates another relative position relationship between the pixels and the metal mesh units of an exemplary display panel consistent with various disclosed embodiments of the present disclosure.

FIG. 3 illustrates a top view of an exemplary display panel consistent with various embodiments of the present disclosure. FIG. 4 is an AA'-sectional view of the exemplary display panel in FIG. 3. FIG. 5 illustrates a top view of a touch control metal layer of an exemplary display panel consistent with various embodiments of the present disclosure. FIG. 6 illustrates a relative position relationship between the pixels and the metal mesh units of an exemplary display panel consistent with various embodiments of the present disclosure. FIG. 7 illustrates another relative position relationship between the pixels and the metal mesh units of an exemplary display panel consistent with various embodiments of the present disclosure.

As shown FIGS. 3-7, a display panel 200 is provided. The display panel 200 may include a display layer 20 and a touch control layer 30 that are stacked together. The display layer 20 may include a plurality of sub-pixels 25 arranged as a matrix. The plurality of sub-pixels 25 may form a plurality of pixel units 24. The number of sub-pixels 25 included in one pixel unit 24 may be greater than or equal to 3 and less than or equal to 8.

The touch control layer 30 may include a bridge layer 31, an insulation layer 32, and a touch control metal layer 33. The insulation layer 32 may be disposed between the bridge layer 31 and the touch control metal layer 33.

The touch control metal layer 33 may include a plurality of metal mesh units 50. The metal mesh units 50 may be disposed corresponding to the pixel units 24. In the touch control metal layer 33, the adjacent metal mesh units 50 may not be connected to each other.

The display panel may also include at least one first touch control electrode 40. The at least one touch control electrode 40 may include a plurality of metal mesh units 50. For one of the at least one first touch control electrode 40, two adjacent metal mesh units 50 may be electrically connected by a connection lead 34. The connection lead 34 may be disposed on the bridge layer 31. The insulation layer 32 may include a plurality of via holes 35, and the connection lead 34 may be electrically connected to the metal mesh units 50 through the via holes 35.

In particular, referring to FIGS. 3-8, the display panel 200 provided by the present disclosure may include a display layer 20 and a touch control layer 30 that are disposed in an order from bottom to top. The display layer 20 may include a plurality of sub-pixels 25. The plurality of sub-pixels 25 may be arranged in a matrix form, and the display layer 20 may include a plurality of pixel units 24. The number of sub-pixels 25 included in one of the plurality of pixel units 24 may be greater than or equal to 3 and less than or equal to 8. For illustrative purposes, the example that one pixel unit 24 includes three sub-pixels 25 is shown in FIG. 6; and the case that one pixel unit 24 includes six sub-pixels 25 is shown in FIG. 7. The three sub-pixels corresponding to one pixel unit 24 in FIG. 6 may be a red sub-pixel R, a green sub-pixel G, and a blue sub-pixel B. The colors of the sub-pixels corresponding to one pixel unit 24 may not be limited by the present disclosure. In some embodiments of the present disclosure, one pixel unit may also include, for example, two red sub-pixels R and one blue sub-pixel B, etc.

In one embodiment, in the display panel provided by the present disclosure, the first touch electrodes 40 may be all be disposed on the touch control metal layer 33. It should be noted that the touch control electrodes may often include touch sensing electrode and touch driving electrodes. The first touch control electrodes 40 mentioned in the present disclosure may refer to one of touch sensing electrodes or touch driving electrodes. Referring to FIG. 5, the touch control metal layer 33 may include a plurality of metal mesh units 50. In the touch control metal layer 33, each of the first touch control electrodes 40 may include a plurality of metal mesh units 50; and there may be no line connection between adjacent metal mesh units 50. Within one first touch control electrode 40, the connection between the metal mesh units 50 may be realized through the via holes 35. For the adjacent two first touch control electrodes 40, an insulation among the touch control electrodes 40 may be realized by not disposing the connection via holes 35. In particular, in the touch control metal layer 33, the metal mesh units 50 in a same first touch control electrode 40 may be broken to become non-continuous, and the breaking manner may be the same as the breaking manner of the edges of two adjacent mutually insulated first touch electrodes 40. In particular, both of them may be broken to become non-continuous regions. Moreover, the edge and the inside of the same first touch control electrode 40 may all be broken. Further, because one metal mesh unit 50 may correspond to 3-8 sub-pixels 25, on the one hand, the metal mesh units 50 may be substantially small. The size of the metal mesh unit may be referred to as the size which is indistinguishable to the naked eyes at a certain viewing distance. Accordingly, the condition that the size of the metal mesh unit 50 is substantially small may prevent the issue that the metal mesh units 50 are visible on the touch display panel. On the other hand, because the size of the metal mesh unit 50 is relatively small, the number of metal mesh units 50 in the touch control metal layer 33 may be substantially large; and the broken positions (non-continuous regions) of the metal mesh units 50 on the entire touch control metal layer 33 may be increased and more uniform. Thus, the possibility of the unacceptable display performance due to uneven density non-continuous regions or position difference of non-continuous regions in the existing techniques may be reduced. Accordingly, the display brightness of the display panel may be more uniform; and the display performance of the display panel and the display apparatus may be improved, and it may facilitate the fingerprint identification under the optical screen.

It should be noted that, for illustrative purposes, in FIG. 5, only the condition that one first touch control electrode 40 includes two metal mesh units 50 is illustrated. In other embodiments, the first touch control electrode 40 may include one or more metal mesh units 50; and the number of the metal mesh units included in one first touch control electrode is not specifically limited in the present disclosure.

Further, in the display panel provided by the present disclosure, the insulation layer 32 in the touch control layer 30 may include a plurality of via holes 35, and one first touch control electrode 40 may be divided into a plurality of metal mesh units 50. For one first touch control electrode 40, two adjacent metal mesh units 50 may be electrically connected by a connection lead 34 disposed on the bridge layer 31. Because one metal mesh unit 50 may correspond to 3-8 sub-pixels 25, the number of metal mesh units 50 included in one touch control electrode 40 may be significantly increased. The greater the number of the metal mesh units 50 is, the greater the number of via holes 35 connecting different metal mesh unit 50 in the same touch control electrode 40 is. By forming the plurality of via holes 35 in the insulation layer 32, the stress endured by the insulation layer 32 when bending may be reduced. Thus, the entire display panel may be less stressed when being bent; and the bending performance of the display panel may be improved.

In one embodiment, the via holes 35 penetrating through the insulation layer 32 may be evenly distributed in the insulation layer 32. Thus, each region of the touch control layer 30 may have a better bending performance, and various regions of the entire display panel may also have an acceptable bending performance.

It should be noted that the embodiment shown in FIG. 4 only schematically shows a relative position relationship between the layers in the display panel and may not represent the size and the number of the actual layer structure of the display panel. Further, FIG. 3, FIG. 6 and FIG. 7 also schematically illustrate one arrangement of sub-pixels. In some other embodiments of the present disclosure, the sub-pixels may also adopt other arrangement manners; and the arrangement of the sub-pixels is not specifically limited by present disclosure.

In one embodiment, referring to FIG. 4, the display layer 20 may include a substrate 10, a transistor array layer 21, a light-emitting layer 22, and an encapsulation layer 23 that are sequentially stacked together. The touch control layer 30 may be disposed on a side of the encapsulation layer 23 away from the light-emitting layer 22. In the touch control layer 30, the touch control metal layer 33 may be disposed on a side of the insulation layer 32 away from the substrate 10.

In particular, the touch control metal layer 33 in one embodiment of the present disclosure may adopt an on-cell structure. The touch control layer 30 may be disposed on the encapsulation layer 23, and the touch control metal layer 33 may be disposed on the insulation layer 32. In particular, the touch control electrodes may be disposed on the encapsulation layer 23. The on-cell structure may only need to form a simple electrode pattern on the touch control layer; and the technical difficulty may be relatively low. Thus, it may be easy to ensure the yield. Further, the effective display area in the pixel display area may not be reduced. Thus, the display effect of the display panel 200 may not be reduced. In addition, when the touch control metal layer 33 is disposed on the side of the insulation layer 32 away from the substrate 10, when a touch body touches the display panel, the setting manner may make the touch control metal layer 33 closer to the touch body. Thus, the first touch control electrode 40 disposed on the touch control metal layer 33 may sense the touch signal more sensitively; and it may facilitate to increase the touch sensitivity of the display panel.

It should be noted that, in the display panel provided by the present disclosure, the transistor array layer 21 may include a plurality of driving thin film transistors, and the light-emitting function layer 22 may include an anode, an organic light-emitting material layer and a cathode. The drain electrode of the driving thin film transistor may be electrically connected to the anode on the light-emitting function layer 22 for transmitting a driving signal to the anode to cause the organic light-emitting material layer to emit light; and thereby enable the display panel to realize the screen display function.

In one embodiment, referring to FIG. 4, the substrate 10 may be a flexible substrate. In particular, using the flexible material as the substrate 10 may make the display panel 200 thinner and lighter, and to have the characteristics of being bendable and flexible; and the functions of the display panel may be more diversified.

In one embodiment, referring to FIG. 4, the insulation layer 32 may include a layer of organic material. In particular, because the elastic modulus of the organic material may be relatively small, the rigidity may be smaller, and the bending may be easier. Therefore, when the insulation layer includes the organic material layer, the touch control layer 30 may have a desired bending property; and the bending performance of the display panel 200 may be improved.

In one embodiment, referring to FIG. 6, the metal mesh units 50 may include a plurality of metal lines, and the plurality of metal lines may include a plurality of first metal lines 41 extending along the first direction and a plurality of second metal lines 42 extending along the second direction. The plurality of first metal lines 41 and the plurality of second metal lines 42 may intersect to define the mesh holes 43 of the metal mesh, and the orthographic projection of at least one mesh hole 43 on the plane where the substrate 10 is disposed may surround at least one sub-pixel 25.

In particular, one metal mesh unit 50 may include a plurality of first metal lines 41 extending along the first direction and a plurality of second metal lines 42 extending along the second direction. The first metal lines 41 and the second metal lines 42 may intersect to define the mesh holes 43 of the metal mesh. The orthographic projection of at least one mesh hole 43 on the plane of the substrate 10 may surround at least one sub-pixel 25. In particular, at least one sub-pixel 25 may be located in the region of the mesh hole 43 of the metal mesh. Such a configuration may prevent the metal lines from shielding the light-emitting area of the sub-pixels to affect the display effect. Further, the mesh holes 43 of the metal mesh may be disposed corresponding to the sub-pixels 25. Thus, the density of the mesh holes 43 in the metal mesh may be increased; and the touch sensitivity of the display panel 200 may be increased as well. It should be noted that the mesh holes 43 mentioned in the embodiment of the present disclosure may be a closed circular structure defined by the intersection of the metal lines.

Further, in one embodiment, referring to FIG. 6, the minimum distance D1 between two adjacent metal mesh units 50 may be smaller than the length of the sub-pixel 25. The length of the sub-pixel 25 may be the minimum value of a first length D11 and a second length D12. The first length D11 may refer to the sum of the length of the sub-pixel 25 along the first direction and the spacing between the adjacent two sub-pixels 25 along the first direction. The second length D12 may refer to the sum of the length of the sub-pixel 25 along the second direction and the spacing between the adjacent two sub-pixels 25 along the second direction.

In particular, in the touch control metal layer 33, the adjacent two metal mesh units 50 may be connected through the connection lead 34 in the via holes 35 in the insulation layer 32 and the bridge layer 31, and the minimum distance D1 between two adjacent metal mesh units 50 may be smaller than the length of the sub-pixel 25 such that the minimum distance between adjacent two metal mesh units 50 may be substantially small. In particular, the size of the non-continuous region may be substantially small. When the size at the non-continuous regions is substantially small, the non-continuous regions may be difficult to be seen by naked eyes. Thus, the possibility of the visualization of the broken positions between metal mesh units 50 may be reduced. Further, such a configuration may minimize the length of the connection lead 34 under the premise that the two adjacent metal mesh units 50 may be connected through the connection lead 34 in the via holes 35. Accordingly, the impedance of the connection lead 40 may be reduced; and the wiring complexity and the interference to the circuit may be reduced.

In one embodiment, referring to FIG. 6, for two adjacent metal mesh units 50 electrically connected by the connection lead 34, the two metal lines directly connected to the connection lead 34 may be the second metal lines 42. The two metal lines that are directly electrically connected to the connection lead 34 may be disposed on a same straight line extending along the second direction.

In particular, referring to FIG. 6, the metal lines between the adjacent two metal mesh units 50 may be directly electrically connected through the connection lead 34 disposed on the bridge layer 31. Further, the extending direction of the connection lead 34 and the extending direction of the two metal lines directly connected to the connection lead 34 may be the same (FIG. 6 illustrates the second direction). Thus, when the second metal lines 42 disposed on a same straight line are connected to the connection lead 34 having the same direction as the extending direction of the second metal lines 42, considering that the straight line between the two points is the shortest, the connection between the two adjacent metal mesh units 50 may be realized by using the connection lead 34 having a relatively short length. Thus, the total wiring length of the connection lead 34 in the display panel may be significantly reduced, and the impedance of the connection lead and the interference to the circuit may be reduced.

In one embodiment, referring to FIG. 6, a plurality of metal mesh units 50 may be sequentially arranged along the first direction to form a metal mesh unit row, and a plurality of metal mesh unit rows may be sequentially arranged along the second direction. A plurality of metal mesh units 50 may be sequentially arranged along the second direction to form a metal mesh unit column. A plurality of metal mesh unit columns may be sequentially arranged along the first direction. The metal mesh units 50 in the adjacent two metal mesh unit rows may be staggered along the first direction. For one first touch control electrode 40, one metal mesh unit 50 may be electrically connected to four adjacent metal mesh units 50 in adjacent rows by the connection leads 34, respectively.

In particular, a plurality of metal mesh units 50 sequentially arranged along the first direction may form a metal mesh unit row, and a plurality of metal mesh units 50 sequentially arranged along the second direction may form a metal mesh unit column. From the viewing angle shown in FIG. 6, the first direction may be a lateral direction, and the second direction may be a longitudinal direction. The metal mesh units 50 in the two adjacent metal mesh unit rows may be staggered along the first direction; and one metal mesh unit 50 may be electrically connected with four adjacent metal mesh units 50 in the adjacent metal mesh unit rows through the connection leads 34 disposed on the bridge layer 31. In particular, the metal mesh unit 50 at the center position will be respectively distributed with non-continuous regions, and one metal mesh unit 50 may correspond to only three sub-pixels. Such a configuration may not only facilitate to increase the non-continuous regions on the entire touch control metal layer, but also make the non-continuous regions to be more evenly distributed over the entire touch control metal layer. Thus, the problem that the touch electrodes are visible caused by the uneven non-continuous regions may be reduced. Further, when the distribution of the non-continuous regions is more uniform, the distribution positions of the corresponding connection via holes on the insulation layer may be more uniform. The large number of evenly distributed via holes may facilitate to reduce the bending stress of the insulation layer when the display panel is bent; and the bending performance of the display panel may be improved. FIG. 6 shows only one arrangement of the sub-pixels. In some embodiments of the present disclosure, the sub-pixels and the pixel units may also adopt other arrangements, and the arrangement of the sub-pixels and the pixel units is not specifically limited in the present disclosure.

In one embodiment, referring to FIG. 6, the metal mesh unit 50 may include a mesh hole 43. The orthographic projection of the mesh hole 43 on the substrate 10 may surround a sub-pixel 25.

In particular, referring to FIG. 6, the metal mesh unit 50 may be disposed corresponding to the pixel unit 24, and the pixel unit 24 may include one pixel. Thus, one metal mesh unit 50 may also correspond to one pixel. The pixel may include a red sub-pixel R, a green sub-pixel G, and a blue sub-pixel B. The red sub-pixel R may be surrounded by the mesh hole 43. When a metal mesh unit 50 includes the mesh hole 43, it may be advantageous to reduce the size of the metal mesh unit 50. Accordingly, the problem that the touch control patterns are visible under the squint angle may be avoided, the graphic display may be more uniform, and the display effect may be improved. FIG. 6 only shows the case where the mesh hole 43 surrounds the red sub-pixel R. In some other embodiments of the present disclosure, the mesh hole 43 may also surround the green sub-pixel G or the blue sub-pixel B. The pixel surrounded by the mesh hole is not specifically limited by the present disclosure.

In one embodiment, referring to FIG. 7, the plurality of metal mesh units 50 may be sequentially arranged along the first direction and the second direction, respectively. The metal lines of the metal mesh unit 50 may define two mesh holes 43. The two mesh holes 43 of one metal mesh unit 50 may be arranged along the third direction, and the third direction may intersect both the first direction and the second direction.

In particular, as shown in FIG. 7, the pixel unit 24 corresponding to the metal mesh unit 50 may include two pixels. In particular, the two pixels may include two red sub-pixels R, two green sub-pixels G, and two blue sub-pixels B, respectively. The two red sub-pixels R may be respectively surrounded by one mesh hole 43 such that the metal lines of the metal mesh unit 50 may define two mesh holes 43. Thus, the size of the metal mesh unit 50 may be reduced; and the problem that the touch patterns are visible under a squint angle may be avoided. Accordingly, the graphic display may be more uniform and the display effect may be improved. Further, the sub-pixels surrounded by the mesh hole 43 may be regularly arranged along the third direction. Thus, the arrangement of the sub-pixels may be simplified, and the production efficiency of the display panel may be improved. FIG. 7 only shows the case where the mesh hole 43 surrounds the red sub-pixel R. In some other embodiments of the present disclosure, the mesh hole 43 may also surround the green sub-pixel G or the blue sub-pixel B. The pixels surrounded by the mesh hole are not specifically limited by the present disclosure.

It should be noted that, in the embodiment of FIG. 6 and FIG. 7, only the case that one pixel includes the red sub-pixel R, the green sub-pixel G, and the blue sub-pixel B, and an arrangement manner of the sub-pixels are illustrated. In some other embodiments of the present disclosure, one pixel may also include four sub-pixels, and the arrangement manner thereof may also be flexibly set, and the number of the sub-pixels and the arrangement of sub-pixels are not specifically limited by the present disclosure.

Further, in the viewing angles shown in FIG. 6 and FIG. 7, the extending directions of the connection leads 34 may all be the second direction. In some embodiments of the present disclosure, the extending directions of the connection leads 34 may also be the first direction. Alternatively, the extending directions of portions of the connection leads may be the first direction, and the extending directions of the rest of the connection leads may be the second direction. The extending directions of the connection leads are not specifically limited in the present disclosure. Further, only a relative position relationship between the connection leads 34 and the metal lines are shown in FIGS. 6-7, and the drawing in FIGS. 6-7 may not represent the actual sizes of the connection leads.

In one embodiment, referring to FIG. 6 and FIG. 7, in the touch control metal layer 33, the plurality of metal mesh units 50 may be arranged as a matrix.

In particular, the plurality of metal mesh units 50 of the touch control metal layer 33 may be arranged as a matrix, and the adjacent metal mesh units 50 may be electrically connected by one of the connection leads 34. Because the metal mesh units 50 may be arranged as a matrix, no matter which part is touched by the user, the system may all be able to react to the corresponding touch action. The manner in which the plurality of metal mesh units 50 are arranged as a matrix may allow the arrangement of the metal mesh units 50 to be followed by a certain rule, and the metal mesh units 50 may be formed by an uniform arrangement. Thus, the production process of the display panel may be simplified; and the production efficiency of the display panel may be improved.

Figure 8:
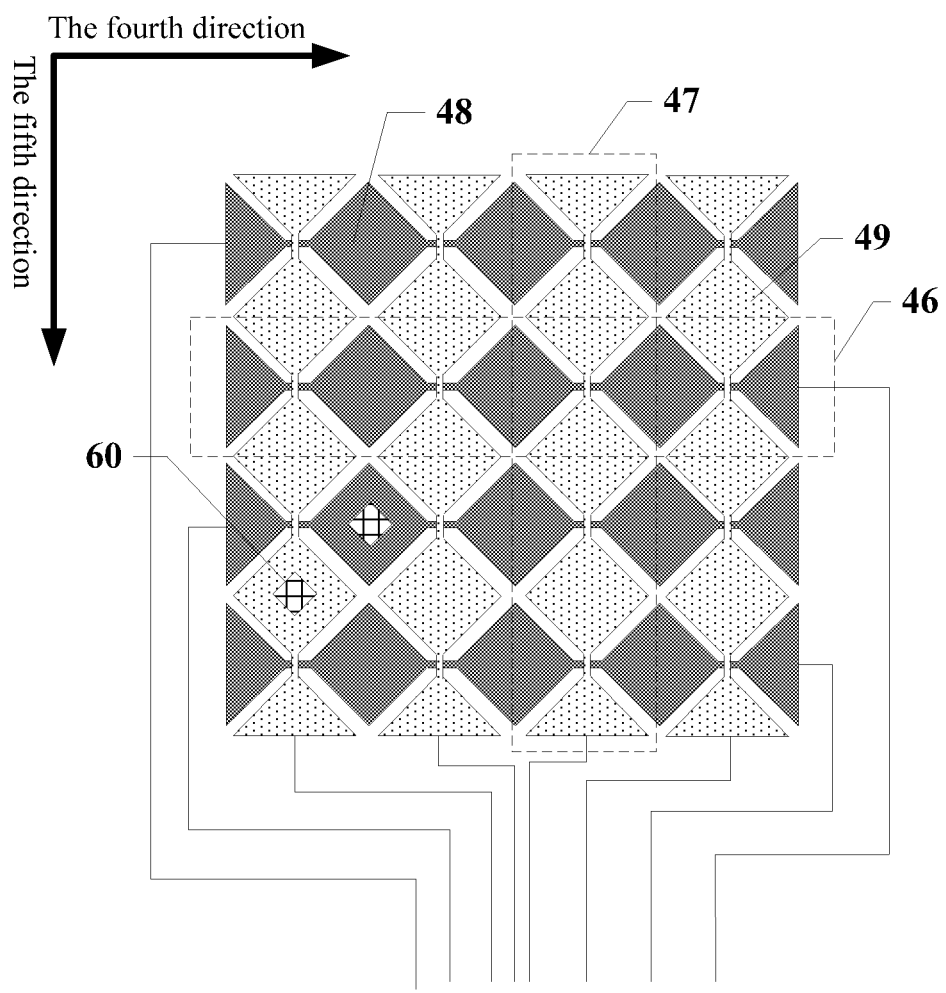
FIG. 8 illustrates a touch control metal layer of an exemplary display panel consistent with various disclosed embodiments of the present disclosure.

FIG. 8 illustrates an exemplary touch control metal layer consistent with various disclosed embodiments of the present disclosure. In one embodiment, as shown in FIG. 8, the touch metal layer may include a plurality of first touch electrodes, and the plurality of first touch electrodes may include a plurality of touch driving electrodes 48 or a plurality of touch sensing electrodes 49. The touch driving electrodes 48 may be insulated from the touch sensing electrodes 49. A plurality of touch driving electrodes 48 may be arranged along a fourth direction to form a touch driving electrode group 46. A plurality of touch driving electrode groups 46 may be arranged along a fifth direction. A plurality of touch sensing electrodes 49 may be arranged along the fifth direction to form a touch sensing electrode group 47. A plurality of touch sensing electrode groups 47 may be arranged along the fourth direction. The fourth direction may intersect with the fifth direction.

At the positions where the touch driving electrode groups 46 and the touch sensing electrode groups 47 intersect each other, the adjacent two touch driving electrodes 48 may be electrically connected by a bridge line, and the bridge line may be located on the bridge layer 31. In some embodiments, two adjacent touch sensing electrodes 49 may be electrically connected by a bridge line, and the bridge line may be located on the bridge layer 31.

In particular, referring to FIG. 8, in the display panel provided by the present disclosure, the touch electrodes disposed on the touch metal layer may include the touch driving electrodes 48 and the touch sensing electrodes 49, and the touch driving electrodes 48 and the touch sensing electrodes 49 may be insulated from each other. The plurality of touch driving electrodes 48 may be arranged along the fourth direction to form the touch driving electrode group 46, and the plurality of touch sensing electrodes 49 may be arranged along the fifth direction to form the touch sensing electrode group 47. As used herein, the fourth direction may be the same as the first direction, and the fifth direction may be the same as the second direction. Two adjacent touch driving electrodes 48 may be electrically connected through a bridge line, or two adjacent touch sensing electrodes 49 may be electrically connected through a bridge line. The bridge line may be disposed on the bridge layer 31. Because the touch driving electrodes 48 and the touch sensing electrodes 49 may be arranged with an intersecting manner, when two adjacent touch driving electrodes 48 in the touch control layer 33 are directly connected, the adjacent two touch sensing electrodes 49 may need to be connected through the bridge line disposed on the bridge layer. Such a configuration may ensure a reliable electrical connection among the touch driving electrodes 48 in the touch driving electrode group 46 and a reliable electrical connection among the touch sensing electrodes 49 in the touch sensing electrode group 47. Further, the insulation between the adjacent touch driving electrodes 48 and the touch sensing electrodes 49 may be ensured. Accordingly, a reliable touch function of the touch driving electrodes 48 and the touch sensing electrodes 49 during the touch phase may be ensured. Generally, the touch driving electrode groups 46 and the touch sensing electrode groups 47 may be respectively electrically connected to the driving chip through touch signal leads. During the touch phase, the driving chip may send the touch driving signals to the touch driving electrode groups through the touch signal leads. When the touch sensing electrode groups 47 sense the touch operation of the touch body, the touch sensing signals may be sent to the driving chip through the touch signal leads, and the driving chip may determine the touch position according to the touch sensing signals; and the touch function of the display panel may be realized.

In one embodiment, referring to FIG. 4 and FIG. 8, the touch control metal layer 33 may also include a dummy touch control electrode 60. The dummy touch control electrode 60 may be insulated from the first touch control electrode 40. The dummy touch control electrode 60 may include a plurality of mesh units.

The dummy touch control electrode 60 may be disposed at least between two adjacent first touch electrodes 40 and/or inside the first touch control electrode 40. Two adjacent metal mesh units in one dummy touch control electrode 60 may be insulated from each other.

In particular, the electrochemical oxidation rate of the edge electrode may be proportional to the intensity of the lateral electric field at the edge electrode. To reduce the lateral electric field at the edge electrode, the dummy touch control electrode 60 may be disposed on the touch metal layer 33. The dummy touch control electrode 60 may be insulated from the first touch control electrode 40. The dummy touch control electrode 60 may include a plurality of metal mesh units 50 and two adjacent metal mesh units 50 in the dummy touch control electrode 60 may be insulated from each other. In particular, the dummy touch control electrode 60 and the first touch electrodes 40 may also be broken. Thus, the lateral electric field generated between the adjacent electrodes may cause the dummy touch control electrode 60 to obtain a varying potential. Accordingly, the transverse electric field strength between the dummy touch control electrode 60 and the first touch control electrode 40 may be reduced; and in turn, the adverse effects of the electrochemical oxidation on the edge electrode may be reduced. It should be noted that, in the present disclosure, the metal mesh unit 50 inside the dummy touch control electrode 60 may not have a connection via hole. In particular, the metal mesh units inside the dummy touch control electrode may not be connected. Thus, the overall distribution of the broken positions in the metal mesh units on the touch control metal layer may be more uniform; and the unacceptable display effect caused by uneven density of the non-continuous portions or position differences of the non-continuous portions may be reduced. Further, in a dummy touch control electrode 60, the adjacent two metal mesh units 50 may be insulated from each other. Because the dummy touch control electrode 60 may not transmit signals themselves, it may not be necessary to electrically connect the metal mesh units inside the dummy touch control electrode 60. Thus, the production process may be simplified, and the production efficiency of the display panel may be increased.

It should be noted that, only one case where the dummy touch control electrode 60 is disposed inside the first touch control electrode 40 is shown in FIG. 8. In some embodiments of the present disclosure, the dummy touch control electrode 60 may also be disposed at other position inside the first touch control electrode 40 or may be disposed between two adjacent first touch electrodes 40. The position of the dummy touch control electrode is not limited by the present disclosure.

Figure 9:
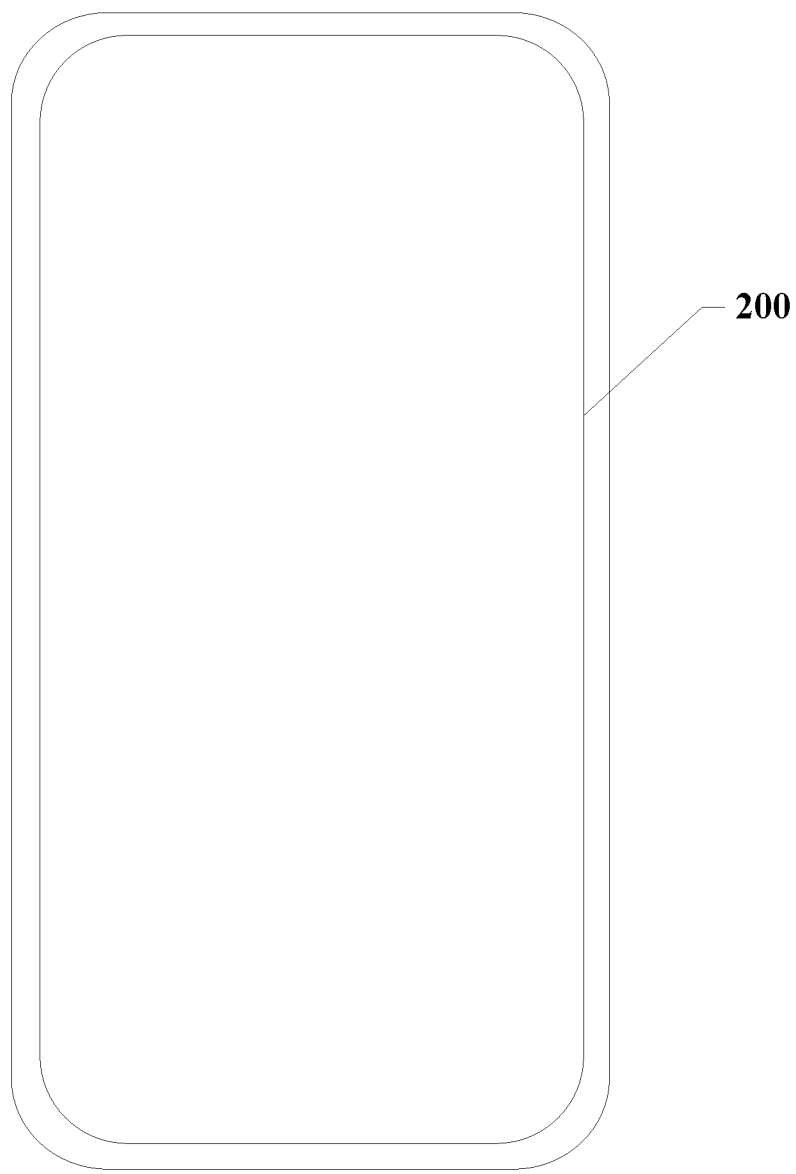
FIG. 9 illustrates an exemplary display apparatus consistent with various disclosed embodiments of the present disclosure.

The present disclosure also provides a display apparatus. FIG. 9 illustrates an exemplary display apparatus 300 consistent with various disclosed embodiments of the present disclosure.

As shown in FIG. 9, the display apparatus 300 may include a display panel 200. The display panel 200 may be a display panel provided by various disclosed embodiments of the present disclosure, or other appropriate display panel.

It should be noted that the embodiment of the display apparatus 300 provided by the present disclosure may be referred to the embodiments of the display panel 200 described above; and details are not described herein again. The display apparatus 300 provided by the present disclosure may be any product or component having a display function, such as a mobile phone, a tablet computer, a television, a display, a laptop computer, a digital photo frame, or a navigation device, etc.

The display panel and the display apparatus provided by the present disclosure may achieve at least the following beneficial effects.

In the display panel and the display apparatus provided by the present disclosure, the plurality of sub-pixels in the display layer may be divided into a plurality of pixel units, and the number of sub-pixels included in one pixel unit may be greater than or equal to 3 and less than or equal to 8. The touch control metal layer may include a plurality of metal mesh units corresponding to the pixel units. In the touch control metal layer, each of the first touch electrodes may include a plurality of metal mesh units, and there may be no connection line between adjacent metal mesh units. In particular, in the touch control metal layer, the breaking processes for making the touch control metal layer to be non-continuous between the edge and the inside of a same first touch control electrode may be the same; and they may all be broken by different metal mesh units. Further, the edge and the inside of the first touch control electrode may also be broken. Further, one metal mesh unit may correspond to 3-8 sub-pixels, and the number of metal mesh units in the touch control metal layer may be increased. Thus, the non-continuous portions of the metal meshes on the entire touch control metal layer may be more and more uniform. Further, the size of the metal mesh units is indistinguishable to naked eyes at a certain viewing distance. Thus, it may be advantageous to reduce the possibility of poor display performance caused the uneven density of the non-continuous portions or position differences of the non-continuous portions. Thus, the display brightness of the display panel may be more uniform; and the display performance of the display panel and the display apparatus may be improved. At the same time, the fingerprint identification under the optical screen may be facilitated.

Further, in the display panel and the display apparatus provided by the present disclosure, a plurality of via holes may be disposed in the insulation layer in the touch control layer, and one first touch control electrode may be divided into a plurality of metal mesh units. For a first touch control electrode, two adjacent metal mesh units may be electrically connected by a connection lead disposed on the bridge layer. Because one metal mesh unit may correspond to 3-8 sub-pixels, the number of metal mesh units included one first touch control electrode may be significantly increased. The greater the number of metal mesh units is, the greater the number of connection via holes connecting different metal mesh units in the same touch electrode is. Disposing the large number of via holes may make the insulation layer to have a smaller stress when bending. Thus, the entire display panel may be less stressed when being bent; and the bending performance of the display panel and the display apparatus may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
a display layer and a touch control layer, stacked together, wherein:
the display layer includes a plurality of pixel units on a substrate, one pixel unit of the plurality of pixel units including a number N of sub-pixels arranged as a matrix, wherein the number N is greater than or equal to 3 and smaller than or equal to 8;
the touch control layer includes a bridge layer, an insulation layer and a touch control metal layer, the insulation layer being disposed between the bridge layer and the touch control metal layer;
the touch control metal layer includes a plurality of metal mesh units;
the plurality of metal mesh units corresponds to the plurality of pixel units;
in the touch control metal layer, adjacent metal mesh units of the plurality of metal mesh units are not directly connected;
the touch control metal layer also includes at least one first touch control electrode;
one first touch control electrode of the at least one first touch control electrode includes multiple metal mesh units of the plurality of metal mesh units;
in the one first touch control electrode, adjacent two metal mesh units of the multiple metal mesh units are electrically connected through a connection lead;
the connection lead is disposed on the bridge layer;
the insulation layer includes a plurality of via holes; and
the connection lead is electrically connected to each of the adjacent two metal mesh units in the one first touch control electrode through a corresponding via hole in the insulation layer, wherein:
a metal mesh unit of the plurality of metal mesh units includes a plurality of metal lines;
the plurality of metal lines include a plurality of first metal lines extending along a first direction and a plurality of second metal lines extending along a second direction;
the plurality of first metal lines intersect the plurality of second metal lines to define mesh holes of the metal mesh unit;
an orthographic projection of at least one mesh hole on the substrate surrounds at least one sub-pixel of the plurality of sub-pixels;
the plurality of metal mesh units include a plurality of metal mesh unit rows disposed along the first direction and a plurality of metal mesh unit columns disposed along the second direction;
metal mesh units in two adjacent metal mesh unit rows are staggered along the first direction; and
for the one first touch control electrode, one metal mesh unit is respectively electrically connected with four adjacent metal mesh units in adjacent metal mesh rows through connection leads.

2. The display panel according to claim 1, wherein:
a minimum distance between two adjacent metal mesh units of the plurality of metal mesh units is smaller than a length of one sub-pixel,
wherein:
the length of the one sub-pixel is a minimum one of a first length and a second length;
the first length is a sum of a length of the one sub-pixel along the first direction and a spacing between two adjacent sub-pixels along the first direction; and
the second length is a sum of a length of the one sub-pixel along the second direction and a spacing between two adjacent sub-pixels along the second direction.

3. The display panel according to claim 1, wherein:
for the two adjacent metal mesh units in the one first touch control electrode electrically connected by the connection lead, two metal lines electrically connected to the connection lead are both second metal lines; and
the two metal lines electrically connected to the connection lead are disposed on a same straight line extending along the second direction.

4. The display panel according to claim 1, wherein:
one metal mesh unit includes one mesh hole; and
an orthographic projection of the mesh hole on a plane of the substrate surrounds one sub-pixel.

5. The display panel according to claim 1, wherein:
the plurality of metal mesh units are sequentially arranged along the first direction and the second direction, respectively;
metal lines of one of the plurality of metal mesh units define two mesh holes in one metal mesh unit;
the two mesh holes in the one metal mesh unit are arranged along a third direction; and the third direction intersects both the first direction and the second direction.

6. The display panel according to claim 1, wherein:
the touch control metal layer includes a plurality of first touch control electrodes;
the plurality of first touch control electrodes include a plurality of touch driving electrodes or a plurality of touch sensing electrodes;
the plurality of touch driving electrodes are insulated from the plurality of touch sensing electrodes;
the plurality of touch driving electrodes are arranged as a touch driving electrode group along a fourth direction;
the plurality of touch sensing electrodes are arranged as a touch sensing electrode group along a fifth direction;
a plurality of touch driving electrode groups are arranged along the fifth direction;
a plurality of touch sensing electrode groups are arranged along the fourth direction;
the fourth direction intersects the fifth direction;
at intersecting positions of the plurality of touch driving electrode groups and the plurality of touch sensing electrode groups, two adjacent touch driving electrodes are electrically connected by a bridge line; the bridge line is disposed on the bridge layer; or
two adjacent touch sensing electrodes are electrically connected by a bridge line; and the bridge line is disposed on the bridge layer.

7. The display panel according to claim 6, wherein:
the touch control metal layer also includes a dummy touch control electrode;
the dummy touch control electrode is insulated from the plurality of first touch control electrodes;
the dummy touch control electrode includes a plurality of metal mesh units;
the dummy touch control electrode is disposed at least one of between two adjacent first touch control electrodes of the plurality of first touch control electrodes and inside one first touch control electrode of the plurality of first touch control electrodes; and
for metal mesh units in one dummy touch control electrode, two adjacent metal mesh units are insulated from each other.

8. The display panel according to claim 7, wherein:
in the touch control metal layer, the plurality of metal mesh units are arranged as a matrix.

9. The display panel according to claim 1, wherein:
the display layer includes the substrate, a transistor array, a light-emitting layer and an encapsulation layer that are sequentially disposed;
the touch control layer is disposed on a side of the encapsulation layer away from the light-emitting layer; and
in the touch control layer, the touch control metal layer is disposed on a side of the insulation layer away from the substrate.

10. The display panel according to claim 9, wherein:
the substrate is a flexible substrate.

11. The display panel according to claim 9, wherein:
the insulation layer includes an organic material layer.

12. A display apparatus, comprising:
a display panel, including:
a display layer and a touch control layer, stacked together, the display layer including a substrate,
wherein:
the display layer includes a plurality of pixel units, one pixel unit of the plurality of pixel units including a number N of sub-pixels arranged as a matrix, wherein the number N is greater than or equal to 3 and smaller than or equal to 8;
the touch control layer includes a bridge layer, an insulation layer and a touch control metal layer, the insulation layer being disposed between the bridge layer and the touch control metal layer;
the touch control metal layer includes a plurality of metal mesh units;
each of the plurality of metal mesh units corresponds to one of the plurality of pixel units;
in the touch control metal layer, each of the plurality of metal mesh units is not directly connected with adjacent metal mesh units of each of the plurality of metal mesh units;
the touch control layer also includes at least one first touch control electrode;
one first touch control electrode of the at least one first touch control electrode includes multiple metal mesh units of the plurality of metal mesh units;
in the one first touch control electrode, adjacent two metal mesh units of the multiple metal mesh units are electrically connected through a connection lead;
the connection lead is disposed on the bridge layer;
the insulation layer includes a plurality of via holes;
the connection lead is electrically connected to each of the adjacent two metal mesh units in the one first touch control electrode through a corresponding via hole in the insulation layer;
a metal mesh unit of the plurality of metal mesh units includes a plurality of metal lines;
the plurality of metal lines include a plurality of first metal lines extending along a first direction and a plurality of second metal lines extending along a second direction;
the plurality of first metal lines intersect the plurality of second metal lines to define mesh holes of the metal mesh unit;
an orthographic projection of at least one mesh hole on the substrate surrounds at least one sub-pixel of the plurality of sub-pixels;
the plurality of metal mesh units include a plurality of metal mesh unit rows disposed along the first direction and a plurality of metal mesh unit columns disposed along the second direction;
metal mesh units in two adjacent metal mesh unit rows are staggered along the first direction; and
for the one first touch control electrode, one metal mesh unit is respectively electrically connected with four adjacent metal mesh units in adjacent metal mesh rows through connection leads.

13. The display apparatus according to claim 12, wherein:
a minimum distance between two adjacent metal mesh units of the plurality of metal mesh units is smaller than a length of one sub-pixel,
wherein:
the length of the one sub-pixel is a minimum one of a first length and a second length;
the first length is a sum of a length of the one sub-pixel along the first direction and a spacing between two adjacent sub-pixels along the first direction; and
the second length is a sum of a length of the one sub-pixel along the second direction and a spacing between two adjacent sub-pixels along the second direction.

14. The display apparatus according to claim 12, wherein:
for the two adjacent metal mesh units in the one first touch control electrode electrically connected by the connection lead, two metal lines electrically connected to the connection lead are both second metal lines; and the two metal lines electrically connected to the connection lead are disposed on a same straight line extending along the second direction.

15. The display apparatus according to claim 12, wherein:

one metal mesh unit includes one mesh hole; and an orthographic projection of the mesh hole on a plane of the substrate surrounds one sub-pixel.

16. The display apparatus according to claim 12, wherein:

the plurality of metal mesh units are sequentially arranged along the first direction and the second direction, respectively;

metal lines of one of the plurality of metal mesh units define two mesh holes in one metal mesh unit;

the two mesh holes in the one metal mesh unit are arranged along a third direction; and the third direction intersects both the first direction and the second direction.

\* \* \* \* \*